(12) United States Patent
Barbee, Jr. et al.

(10) Patent No.: US 6,278,764 B1
(45) Date of Patent: Aug. 21, 2001

(54) HIGH EFFICIENCY REPLICATED X-RAY OPTICS AND FABRICATION METHOD

(75) Inventors: Troy W. Barbee, Jr., Palo Alto; Stephen M. Lane, Oakland; Donald E. Hoffman, Fremont, all of CA (US)

(73) Assignee: The Regents of the Unviersity of California, Oakland, CA (US)

( * ) Notice: Subject to any disclaimer, the term of this patent is extended or adjusted under 35 U.S.C. 154(b) by 0 days.

(21) Appl. No.: 09/359,581

(22) Filed: Jul. 22, 1999

(51) Int. Cl.⁷ .................................................. G21K 1/06
(52) U.S. Cl. .................................................. 378/84
(58) Field of Search .................. 378/84, 85, 145

(56) References Cited

U.S. PATENT DOCUMENTS

| | | | |
|---|---|---|---|
| 4,525,853 | * 7/1985 | Keem et al. | 378/84 |
| 5,298,745 | 3/1994 | Kernan et al. | 250/292 |
| 5,768,339 | * 6/1998 | O'Hara | 378/145 |

FOREIGN PATENT DOCUMENTS

WO 97/14156   10/1996   (WO) .

OTHER PUBLICATIONS

Ahmad A et al: "Design and fabrication of Low–cost x–ray mirrors" Optics and Laser Technology, NL, Elsevier Science Publishers BV., Amsterdam vol. 28, No. 7, Oct. 1996 XP004069095.

Database WPI Section ch, Week 199510 Derwent Publications Ltd., London, GB: Class L03 an 1995—72154 XP002152729 abstract.

Database WPI section Ch, Derwent Publications, Ltd., London, GB; Class A33, an 1970—69080R XP002152730 abstract.

Ulmer, M.P. et al Electroform replication used for multiple X–ray mirror production: Applied Optics, Dec. 1, 1984, USA, vol. 23, No. 23, p. 4233–4236 XP000955260.

Serlemitsos, P.J. et al "The multilayer option for conical foil X–ray mirrors" Grazing incidence and Multilayer X–ray Optical Sstems, San Diego, CA, USA Jul. 1997, vol. 3113 p. 244–252, XP000961464.

Grazing Incidence and Multilayer X–Ray Optical Systems Published by SPIE (Internat'l Society for Optical Engineering, vol. 3113, Jul. 1997) "The Multilayer Option for Conical Foil X–Ray Mirrors" P.J. Serlemitsos, et al. pp. 244 through 252.

Grazing Incidence and Multilayer X–Ray Optical Systems Published by SPIE (Internat'l Society for Optical Engineering, vol. 3113, Jul. 1997) "Application of Multilayer Coatings to Replicated Substrates" S. Romaine et al. pp. 253 through 259.

"Optical Systems for Soft X–Rays", Alan G. Michette Plenum Press, New York 1986. pp. 81 through 83. Library of Congress Catalog Data. References, pp. 302 through 303.

* cited by examiner

Primary Examiner—Craig E. Church
(74) Attorney, Agent, or Firm—Alan H. Thompson; L. E. Carnahan

(57) ABSTRACT

Replicated x-ray optics are fabricated by sputter deposition of reflecting layers on a super-polished reusable mandrel. The reflecting layers are strengthened by a supporting multilayer that results in stronger stress-relieved reflecting surfaces that do not deform during separation from the mandrel. The supporting multilayer enhances the ability to part the replica from the mandrel without degradation in surface roughness. The reflecting surfaces are comparable in smoothness to the mandrel surface. An outer layer is electrodeposited on the supporting multilayer. A parting layer may be deposited directly on the mandrel before the reflecting surface to facilitate removal of the layered, tubular optic device from the mandrel without deformation. The inner reflecting surface of the shell can be a single layer grazing reflection mirror or a resonant multilayer mirror. The resulting optics can be used in a wide variety of applications, including lithography, microscopy, radiography, tomography, and crystallography.

34 Claims, 6 Drawing Sheets

HIGH EFFICIENCY REPLICATED X-RAY OPTICS AND FABRICATION METHOD

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to x-ray optical devices, particularly devices having a tubular shape, and more particularly to high efficiency replicated x-ray optics and a method of fabrication using a super-polished mandrel.

2. Description of Related Art

X-ray optical devices are used to change the propagation path of travel of x-rays. These devices can also serve to preferentially select x-rays of a desired wavelength range from a broader band of wavelengths. X-ray optical elements primarily use the mechanism of reflection, in contrast to visible light optics that commonly use refraction. To be efficient, x-ray mirrors must have a surface smoothness on the scale of the x-ray wavelength. Since typical x-ray wavelengths are 1–100 Å for these applications, the surface must be smooth on the atomic scale. To provide such a smooth surface is an exceedingly difficult and time-consuming procedure.

In 1952, Wolter proposed the application of a double specular reflection mirror system having a closed surface for focusing of x-rays. This structure was substantially more complex than previous optics and presented serious fabrication difficulties. First attempts to produce Wolter optics were initiated in the 1960's using electrodeposition on negative forms due to the closed surface of these optics. These replication attempts were unsuccessful as very poor figure and surface quality were achieved. In the 1980's, efforts were reinitiated for the development of thin shell structures for space telescopes. These negative form electrodeposition replication efforts have been used in the Czech Republic, Italy, and the United States. Several replication fabricated Wolter structures have been flown in space. These mirrored surfaces achieved the figure and roughness values approaching 15 Å rms that are adequate for those applications, but not for applications requiring greater resolution and using shorter x-ray wavelengths.

The replication technique has the potential of lower cost and ease of manufacture. The cost of internally polishing and coating the surface of a tubular optic (typical length 10 cm, average diameter 2 cm) and achieving the smooth internal surface finish required is on the order of $500,000 and requires about one year to fabricate. Each optic device produced would have similar cost and time considerations. By comparison, the use of a negative form mandrel reduces the cost by a factor of 10–100 per mandrel for substrate preparation during development, with further significant cost reductions in the manufacturing stage. In view of the demonstrated effectiveness of the replication approach in the fabrication of moderate resolution Wolter space telescopes, research was directed towards the use of replicated optics for x-ray microscopes used in inertial confinement fusion studies and collimators for x-ray proximity lithography.

A primary problem with replicated optics has been achieving smoothness on the replicated part. Past efforts have not been able to achieve a roughness less than 12–15 Å rms. This resulted from the low strength of the layer directly in contact with the mandrel and the lack of control of the adhesion of this layer to the mandrel. Parting of the optic from the mandrel causes plastic deformation of the reflecting layer and degradation of the smoothness of the reflecting surface. The decrease in efficiency and attainable imaging resolution resulting from a surface roughness of 12–15 Å rms is unacceptable.

Thus, there is a need for a method to make x-ray optics with a surface roughness less than 12 Å rms. The present invention is based on the recognition that magnetron sputtering deposition can be used, even though previously sputter deposited replicated optics have been of poor quality. The fabrication method of the present invention, based on supporting multilayer structures and a special parting layer, has been developed to produce strong stress-relieved reflecting surfaces with supporting shells that do not deform during the separation process and consequently produce super-smooth surfaces comparable to that of the initial mandrel.

SUMMARY OF THE INVENTION

It is an object of the present invention to provide replicated x-ray optics having a surface roughness of less than 12 angstroms rms and a method for reproducibly fabricating these x-ray optics with a super-smooth surface. A further object of the invention is to provide x-ray optical devices that have a tubular shape, open at both ends, and an interior surface highly reflective to x-rays within a specified wavelength band.

Another object of the invention is to provide x-ray optical devices having shapes that are truncated paraboloidal, ellipsoidal, hyperboloidal, or polynomial shells of revolution.

Another object of the invention is to provide a method of fabricating tubular shaped x-ray optics by dc or rf sputter deposition of reflecting layers onto a super-polished reusable mandrel, strengthening the reflecting layers by a sputter deposited multilayer, then further supporting this structure with a low residual stress electrodeposited layer, and separating the layered optical device from the mandrel, resulting in a tubular shell with an interior surface having the shape and surface smoothness of the mandrel.

A further object of the invention is to provide increased strength to the reflecting layer resulting from a supporting multilayer, which enhances the ability to part the replica from the mandrel without degradation in surface roughness and performance.

Another object of the invention is to provide a parting layer that maintains or enhances the smoothness of the mandrel, provides uniform adhesion, and substantially decreases the adhesion of the reflecting surface material to the mandrel, and reduces the forces required to part the replica structure and thus the potential for increased surface roughness.

Yet another object of the invention is to provide a tubular shaped optic wherein the inner reflecting surface can be composed of either a single layer grazing reflection mirror or a resonant multilayer mirror, where the wavelength bandpass of the multilayer mirror can be used to select a specific band of x-ray energies.

The invention involves high efficiency replicated x-ray optics and the method of fabrication. The x-ray optical device has a tubular shape that is open at both ends, with the interior surface being highly reflective to x-rays within a wavelength band of interest. A beam of x-rays enters one end, undergoes a single reflection at the interior surface, and exits from the other end with a different direction of travel.

The shapes of the optics are truncated paraboloidal, ellipsoidal, hyperboloidal, or polynomial shells of revolution. Optics having a combination of these shapes can also be fabricated from a single mandrel.

The tubular optical devices are fabricated using a reusable mandrel with a super-polished surface. The replicated optic is deposited by dc or rf sputter deposition of a reflecting layer or layers onto the mandrel surface, and thereafter the reflecting layers are strengthened by a sputter deposited multilayer, and then this structure is further supported with a low residual stress electrodeposited layer. A special parting layer of sputter deposited amorphous carbon may be deposited on the mandrel surface prior to deposition of the reflecting structure.

When the layered device is removed from the mandrel, the tubular shell has an inner surface having the shape and surface smoothness of the master form mandrel. Surfaces having a roughness of less than 10 Å rms, and as low as 3–5 Å rms, have been fabricated. The low stress required to part the replica from the mandrel has made possible the maintenance of the surface figure of the mandrel in the replicated part and has also minimized the potential for damage to the mandrel during parting so that multiple replicas can be manufactured from a single mandrel.

The optic elements resulting from the present invention can form single element devices, or combinations of elements can be assembled to form multi-element (compound) devices. The optical elements can be used for applications including x-ray proximity and projection lithography, x-ray crystallography, x-ray microscopy, x-ray radiography, tomography, and x-ray fluorescence analysis. These reflective optics can also be used at longer ultraviolet wavelengths where conventional refractive optics do not exist.

Other objects and advantages of the present invention will become apparent from the following description and accompanying drawings.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

The present invention involves high-efficiency replicated x-ray optics and a method of fabrication. A replicated optic having a tubular shape open at both ends with an interior surface that is highly reflective to x-rays within a wavelength band of interest is fabricated by dc or rf sputter deposition of reflecting layers onto a super-polished reusable mandrel. The reflecting layer or layers are strengthened by a supporting multilayer deposited thereon, and an outer mechanical supporting layer.

The supporting multilayer structure results in stronger stress-relieved reflecting surfaces that do not deform during separation from the mandrel, and consequently produce super-smooth surfaces comparable in smoothness to the initial mandrel surface (i.e., <12 Å, and as low as 3–5 Å rms). The increased strength of the reflecting layer enhances the ability to part the replica from the mandrel without degradation in surface roughness and performance. In addition, a parting layer is typically first sputter deposited on the mandrel to ease removal of the optic from the mandrel and to maintain its surface smoothness.

Upon separation of the layered device from the mandrel, the formed tubular shell has an inner surface with the shape and surface smoothness of the master mandrel. In operation, a beam of x-rays enters one end of the tubular shell, undergoes a single reflection at the interior surface, and exits from the other end with a different direction of travel. The shape of the optics is unlimited since the optical device mimics or replicates the shape of the mandrel. The optics may be truncated paraboloidal, ellipsoidal, hyperboloidal, or polynomial shells of revolution. The optics can be used singly or in combinations to form a range of x-ray optical systems.

Depending on the shape, x-rays are focused, collimated, or otherwise manipulated when they are allowed to enter one end of the shell, reflect from the inner mirrored surface, and then exit in a new direction. The inner reflecting layer may be either a single layer grazing reflection mirrored surface or, alternatively, a multilayer resonance reflection mirrored surface. The wavelength bandpass of the multilayer mirror can be used to select a specific range of x-ray energies.

High efficiency results from the high quality of the mirror, large reflection angles (especially for resonant mirrors), and the large collection solid angle of the tubular structure compared to more conventional open geometry x-ray optics. These optics have a number of applications, including static and scanning collimators for x-ray lithography, one and two element collection and focusing optics for x-ray crystallography, collection and concentration optics for x-ray fluorescence analysis, Wolter and zone-plate x-ray microscopes; x-ray radiographic systems and tomography.

Figure 1:
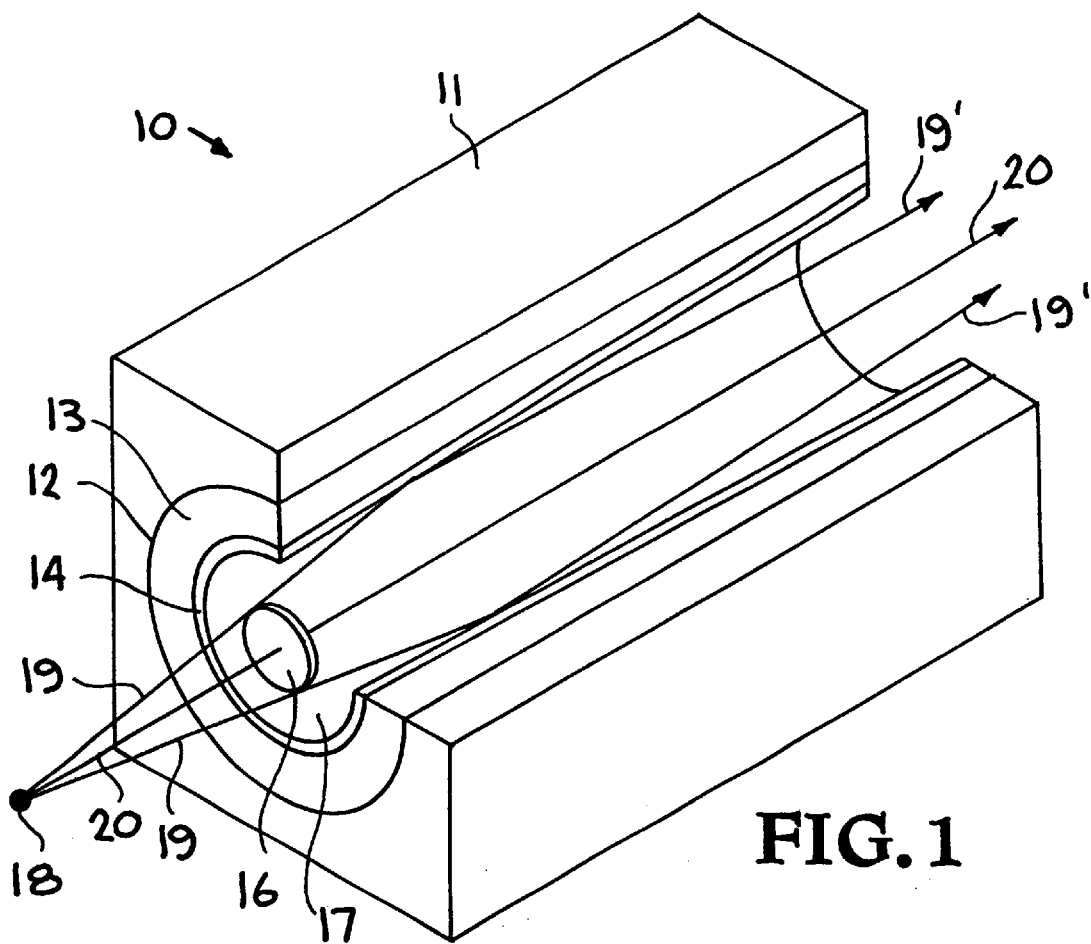
FIG. 1 illustrates in partial cross-section a collimator that incorporates a tubular x-ray optic made in accordance with the present invention.

FIG. 1 illustrates an embodiment of a collimator generally indicated at 10 comprising a collimator housing 11, an opening 12 extending therethrough, in which is located a cone 13 having a tapered inner surface in which is positioned a tapering tubular member 14 having a multilayer reflector shell 15 on the inner surface thereof. A beam block 16 may be located in an open end 17 of tubular shell 14. Thus, a beam of x-rays from a source 18 is directed, as indicated at 19, through the open end 17 and reflected by multilayer reflector shell 15 so as to leave the tubular member 14 in a different direction as indicated by arrows 19'. The direct unreflected x-rays indicated at 20 may be stopped by the beam block 16. This optic is therefore capable of taking a radially diverging radiation pattern produced by a point x-ray source and converting it to a parallel annular beam suitable for semiconductor proximity lithography.

Typical optics that serve as collimators for proximity x-ray lithography optics have been fabricated with a length of approximately 10 cm, a large end diameter of 3–4 cm, and a small end diameter of 2–3 cm. The small end of the optic is typically placed 3–5 cm from an x-ray point source. For lithography applications, a beam block is used to stop the direct unreflected x-rays from exiting the optic as shown in FIG. 1.

The optical structures are made by sputter depositing layers of materials onto a super-smooth mandrel, thus forming the optic from the inside out. When the mandrel is separated from the sputtered shell, the innermost layer replicates the mandrel shape and smoothness and serves as the reflecting surface for the mirror. A cross-sectional view of a reflecting optic deposited on a mandrel is shown in FIG. 2.

Figure 2:
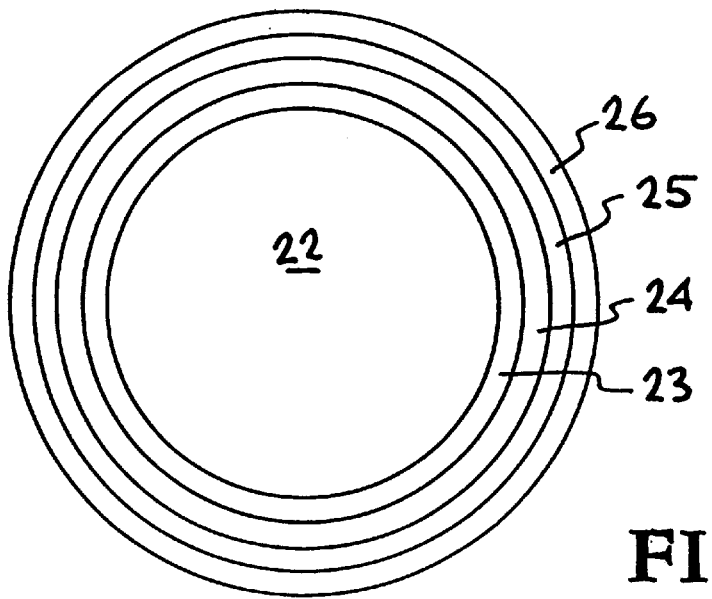
FIG. 2 illustrates the end-view cross-section of a mandrel having a parting layer, reflective coating, a supporting multilayer, and an electroplated outer coating.

Referring to FIG. 2, the mandrel 22 is typically made of glass, ceramic, or a metal such as aluminum. Superpolished electroless nickel coated aluminum mandrels have been used as forms for x-ray collimators. A parting layer 23 may be sputter deposited on the mandrel. Although the parting layer may not be required in some applications, it is preferred. The parting layer is made of a non-wetting and non-chemically interacting material that maintains or improves the mandrel surface quality. Suitable materials include amorphous carbon and carbides such as boron carbide.

The reflecting layer or multilayers 24 are sputter deposited (e.g., by dc magnetron) on the parting layer 23. A single layer forms a grazing incidence mirror; a multilayer is used for resonant multilayer reflectors. A supporting multilayer 25 is then deposited on the reflecting layer(s) 24. An outer supporting layer 26 is then typically electrodeposited on the supporting multilayer 25 for handling purposes.

For a single layer specularly reflecting surface, the reflecting layer typically has a thickness of about 250–600 Å (made of layers about 20 Å thick). The reflecting layer is typically made of materials such as gold, platinum, rhodium, nickel, nickel alloys, rhenium, or alloys of rhenium. A tungsten-rhenium alloy ($W_3Re$) is a common material used to make grazing reflection mirrors.

Alternatively, a series of layers are initially deposited that constitute a multilayer resonant mirror. Multilayer mirrors are typically 1000–3000Å thick and are made of alternating layers of high and low atomic number materials, such as boron carbide ($B_4C$) and $W_3Re$. Multilayer mirrors are capable of much larger reflection angles and thus in many applications can occupy a larger solid angle and thus collect a larger fraction of x-rays.

There are several considerations in the choice of materials for the reflecting surface. If the reflection process is to be specular total external reflection, then the reflecting surface material must have the best optical properties for the wavelengths of interest and be capable of being fabricated with low surface roughness. The specularly reflecting surface material(s) must have good stability in the ambient atmosphere of the exposure system and exhibit good shelf life without extraordinary measures. It should also be possible to clean the reflecting surface of general contaminants that degrade the reflectivity without increasing surface roughness. The optic must have an excellent finish on its internal surface, must have a highly uniform reflective coating, must be true to the desired figure, and must have good mechanical stability.

In order to strengthen the initial reflecting layer, a short period supporting multilayer (d=20 to 30 Å) is deposited having a total thickness of about one micron. The supporting multilayer is made of alternating layers of the reflecting material (e.g., Au, Pt, Ni, Ni alloys, Rh, Re, $W_3Re$) and a metal such as copper, copper-nickel alloy, gold, or silver. The layers of the two materials are of equal thickness (about 1–2 nm each). Alternating layers of materials such as $W_3Re$ and copper (Cu) give the structure unusually large tensile and hoop strength (much greater than is possible using a single material), and thus the robust ability to retain the original mandrel surface smoothness. These multilayer structures have exceptional strength with yield stresses in excess of 300,000 psi, which is greater than either material alone. These multilayer structures have a total thickness of one micrometer and provide a "strong back", which suppresses deformation of the reflecting layer during parting of the mandrel, making possible the production of reflecting surfaces with roughness of 3–5 Å rms.

The deposition of copper is typically continued to form a copper layer approximately 4 micrometers thick to enable electrodeposition of a low residual stress mechanical supporting layer approximately 1 mm thick or greater to improve the sturdiness of the part. This outer layer is made of a material that can be electroplated easily, such as nickel, nickel-copper alloys, copper, stainless steel, iron-nickel alloys, copper-tin alloys, and other copper-based alloys (brass). This outer layer protects the underlying layers from mechanical deformation and contamination, and facilitates the handling of the optical device.

The special parting layer is sputter deposited on the mandrel surface prior to deposition of the reflecting structure and is typically made of amorphous or glassy carbon, or a carbide such as boron carbide. The thickness of the layer is typically 2–5 nm. After separation, any carbon remaining on the optical device does not affect its performance. The mandrel is cleaned of any carbon before being reused, when a new parting layer is deposited.

The parting layer provides two specific characteristics to the mandrel surface of critical importance to the parting of the replica structure from the mandrel. First, adhesion to a polished mandrel surface is not uniform and varies over that surface due to cleanliness and the natural bonding of two clean metal surfaces. This non-uniform adhesion results in shear stresses during parting that deform the reflecting layer. This significantly increases surface roughness and degrades performance. Sputter deposition of an amorphous carbon layer that does not react with the reflecting layer material and has low adhesion with the reflecting material enables parting while maintaining a 3–5 Å rms surface finish. In addition, this amorphous carbon layer improves the smoothness of the mandrel itself prior to deposition of the reflecting layer.

The presence of a parting layer maintains or enhances the smoothness of the mandrel, provides uniform adhesion, and substantially decreases the adhesion of the reflecting surface material to the mandrel, which reduces the forces required to part the replica structure and thus the potential for increased surface roughness. The low stress required to part the replica from the mandrel has made possible the maintenance of the surface figure of the mandrel in the replicated part and minimized the potential for damage to the mandrel during parting so that multiple replicas can be manufactured from a single mandrel.

In a specific embodiment, a prototype collimator structure consists of a carbon parting layer deposited directly on the mandrel surface, followed by a $W_3Re$ x-ray reflecting layer, then a $W_3Re/Cu$ multilayer, a thick Cu film, and finally a thick Ni film. All layers were sputtered except for the nickel, which is electroplated. The purpose of the thick copper film is to protect the reflecting surface and supporting multilayer from atmospheric contamination during transport from the sputtering apparatus to the plating apparatus and to enhance the electroplating of the mandrel. The $W_3Re/Cu$ multilayer provides a good thermal coefficient of expansion match between the copper protective layer and the $W_3Re$ reflective layer. The low residual stress, thick plated nickel layer makes the coating mechanically robust after parting from the mandrel and is also relatively corrosion-resistant.

Production of these optics involved changes to an existing sputtering system and an electroplating apparatus. A special collimator mount was constructed for the sputtering system that allows the mandrel to be rotated around its long axis during deposition. In addition, shields were installed to prevent deposition of sputtered material onto the mandrel at an oblique angle, which could cause columnar film growth and surface finish degradation or co-deposition from the two sources used. This made high quality layering possible. Thus, the exposed mandrel surface looked nearly flat from the point of view of the sputter guns during deposition. The sputter guns used are arrayed on a circle in opposition, concentric with the long axis of the mandrel. Each sputter gun is individually shuttered so that layer deposition is initiated by the opening of the shutters. Layering is achieved as a point on the mandrel surface rotates through the masking apertures of the sources, sputtering Material A and Material B in an alternating sequence: A-B-A-B-A-B.

In the electroplating system, the mandrel, which already has the sputter deposited coating, is suspended from a motor, which rotates it in the bath during deposition. The plating current is supplied by a dc power supply, and a computer controls the entire system. The plating current is also measured by the computer, making possible real-time monitoring of the deposition rate and improved layer thickness control. This makes possible the control of the deposition rate and the residual stress in the nickel deposit. The electro-deposition process parameters are controlled to produce a very low residual stress Ni deposit that makes it substantially easier to maintain the optic figure and to separate it from the mandrel.

Reflectivity measurements performed on $W_3Re$ single films deposited onto flat substrates using the same apparatus as is used to make the optics show excellent agreement with a calculation of the ideal grazing-incidence reflectivity for a single $W_3Re$ film, demonstrating the high quality of the film. The grazing angles of incidence are typically small, thus strongly limiting the solid angle of the optic relative to the radiation-emitting source. This limitation can be partially overcome by the use of multilayer coated resonance reflectors that will function at larger reflection angles increasing the usable source emitted/collected radiation by more than a factor of five.

The replication based manufacturing process for producing x-ray optic surfaces/multilayer structures has multiple steps, depending on the physics of the reflection process and complexity of the reflecting surface structures. The general outline of the manufacturing process steps follows.

1. Selection of materials for specularly reflecting surface or multilayer structure, which provide the needed reflection efficiencies in the spectral ranges of the technical application.
2. Deposition of these materials on super-polished flat surfaces to demonstrate that the required reflection efficiencies are attainable under standard short wavelength reflection optic development conditions.
3. Evaluation of the stability of the structures deposited on the super-polished flats under simulated conditions for the application.
4. If the structures are stable and exhibit acceptable performance, then deposition calibration parameters for the magnetron sputter deposition processes for deposition on the doubly curved replication mandrel surfaces are established.
5. In principle, single layer specularly reflecting surfaces only require that the total thickness of the single reflecting media layer be controlled for effective reflection performance to be achieved. In practice, it is necessary to maintain surface roughness and composition at levels that are technically required for effective performance. Calibration, in this case, requires only a semi-quantitative knowledge of the layer thickness deposited on the replication mandrel surface under specified deposition source and replication mandrel motion conditions. Typical specular reflecting material structures are 25–60 nm thickness.
6. Multilayer resonance reflectors are wavelength dispersive, so if a known wavelength or band of wavelengths is needed for a given application, a specific angle of incidence and multilayer periodicity must be used. The relationship between wavelength, angle of incidence and multilayer periodicity is given by the classic simple Bragg equation: $n\lambda=2d \sin \theta$, where $\lambda$ is the radiation wavelength (nm), d the multilayer period ($d[nm]=t_A+t_B$), and $\theta$ is the grazing angle of incidence on the optic surface. The thicknesses of the two sputtered materials A and B are given by $t_A$ and $t_B$. A correction for refraction of the x-rays by the multilayer is also made, though the principle of operation is shown by the simple Bragg equation. Since the angle of incidence onto the collimator surface varies along the axis of the collimator, the multilayer period must also vary in a manner defined and controllable during optic manufacture so as to maintain the Bragg condition. This is accomplished by accurate masking of the deposition source profile to generate the desired thickness profile, i.e., longitudinal variation in multilayer period.

It may be necessary in some instances to introduce a depth variation in multilayer period for the sputter deposited material. This is accomplished by changing the rotation period of the mandrel in the deposition system or by changing the deposition rates of the two sputtered materials (A, B) that comprise the multilayer. This increases the bandwidth of the multilayer at a particular angle of incidence, which is advantageous in some cases.

7. Preparation of a superpolished (rms<0.3–0.5 nm) master mandrel using metal, glass, or ceramic materials. Surface quality relative to roughness, mid-range figure, and figure in general are shown to be largely determined in this step.
8. Exact replication of the master mandrel surface and figure requires that there be no distortions of the mandrel form introduced by the replication process. The first issue to be considered in achieving this end is the maintenance of surface smoothness. In many cases, the reflecting surfaces are low strength noble metals (e.g., Au), which are easily plastically deformed. Thus, though the mandrel surface may have a smoothness that is nearly atomic (rms<0.2 nm), roughness is introduced as a result of adhesion forces during the parting of the replica from the mandrel. It is also possible that contamination of the uncoated mandrel surface will introduce "roughness" into the parted surface, even though the mandrel itself has a very high surface quality.

In the process described herein, a parting layer of a non-wetting and non-chemically interacting material that maintains or improves the mandrel surface quality is deposited first. The reflecting surface material is deposited on this parting layer. This process refines the grain size of the reflecting layer material and increases its tensile strength. The next sputter deposited structure is a multilayer of copper and the reflecting surface material. This multilayer structure is approximately one micron thick and will typically have a tensile strength greater than 2 GPa. A third layer comprised of copper is then deposited as 4 nm layers, with a total thickness of 4000 nm. This copper layer has a tensile strength of about 0.65 GPa and provides an ideal bonding matrix for the electroplated nickel used to provide macroscopic mechanical integrity.

9. Manufacture of supporting structure or substrate for the replicating structure. The electroforming process starts with the careful preparation of the plating solution. An exemplary solution contains 300 g/L nickel sulfamate hexahydrate, 40-g/L boric acid, and 2-g/L nickel chloride to aid in anode corrosion. Anodes are composed of sulfur depolarized nickel rounds. The rounds are suspended in titanium baskets enclosed in polyethylene anode bags to prevent any particulate matter from entering the solution. The solution is continuously filtered through a 10-micron cartridge at a flow rate of 1200 liters per hour.

After chemical analysis and adjustment to optimal parameters, the samples are processed to determine the deposit internal stress. The method of measurement is a "spread leg" strip. This strip is comprised of beryllium copper (0.2 mm in thickness) with one face of each leg masked off with a polymeric coating. By plating a known thickness of material on the strip and measuring the deflection of each leg from the perpendicular with a calibrated scale, stress values can be determined to ±300 psi. Values of high stress can be reduced either by chemical additives or by low pH/high current density plating on a sacrificial panel.

Plating stress is also influenced by current density, solution temperature, substrate composition, and deposit thickness. Because the substrate and deposit thicknesses were predetermined, solution temperature and current density were the only variables available for modification to reduce internal stress. A careful study of the required thickness and desired internal stress determined a current density of 20 amps per square foot. This produced a deposit rate of 0.025 mm/hr. Deposit thickness on the completed cone is 1.5–1.625 mm, which required 72 hours in the plating tank. Thickness variation from end to end is less than 5%.

A special fixture was designed to minimize any current density variations due to field effects near the ends of the mandrel. Essentially this "burn guard" extends the conical mandrel several inches on each end, and allows for the connection to a rotating fixture. A neoprene washer is fitted between the mandrel and the burn guard to prevent the joining of the two surfaces with the electrodeposited nickel. The rotating fixture uses a special mercury filled contact that allows rotation of the mandrel while passing the DC current and also prevents any ripple or current variations that would be detrimental to the coating properties.

Because the mandrel is vacuum coated, it remains free of any soils, oils, or other material that would reduce adhesion of the electrodeposit or cause inferior deposits. The only pretreatment required is to immerse the mandrel into the plating solution for 30 seconds prior to the initiation of current. This allows the mandrel to rise to the temperature of the plating bath, and the small amount of chloride present removes any oxides that may have formed.

After the electroforming is completed, the mandrel is rinsed and dried, and the removal of the mandrel only requires a small amount of force to the large diameter end to release it from the electroformed mirror assembly.

10. Separation of the super-polished master mandrel and replicated collimator shell structure. An apparatus specifically designed to fit the diameters of the electroplated nickel at the ends of the collimator/mandrel assembly was developed. This made possible kinematic axial loading of the collimator/mandrel assembly to apply a shear load at the mandrel/collimator interface. The system is arranged with the large diameter end of the collimator structure up in this vertical apparatus. A structure to maintain axial alignment of the parted collimator structures is implemented to eliminate damage to the superpolished mandrel or to the inner surface of the parted collimator cone by touch or impact upon release of the collimator structure from the mandrel. All these operations are carried out at room temperature under moderate clean environment conditions.

The mandrel and the replication shell are now removed from the parting apparatus and stored under clean conditions. The primary degradation mechanism for the mandrel appears to be chemical corrosion of the superpolished electroless nickel by the plating electrolyte at the ends of the mandrel. These areas have limited impact on performance and thus, little effect on the operation of the optics. Three collimator structures have been successfully replicated from a single high quality mandrel, and additional structures can be fabricated with the same mandrel structure.

The tubular optical devices fabricated according to the present invention can be used for many applications, and designs for several specific applications are described below.

X-ray proximity lithography is a leading candidate for advanced semiconductor manufacturing when optical lithography techniques are no longer able to meet the resolution requirements for future generations of devices. The resolution limit is determined by diffraction of the illumination source, by the features of the mask, and by the ability of the non-linear photoresist to accentuate variations in the exposure dose (contrast enhancement).

X-ray lithography technology and infrastructure has been under development for a number of years. Under DARPA sponsorship, x-ray masks and aligners have been produced and have demonstrated capabilities suitable for 0.13 $\mu$m device fabrication. Electron storage rings (synchrotrons) have been used as powerful sources of collimated x-ray radiation with an optimum wavelength in the range from 8–11 Å. It appears technically feasible to extend this technology to 0.13 $\mu$m devices and beyond. However, for some applications, the complexity of a multi-beam fabrication facility based on a synchrotron source is not cost-effective.

Such applications include low volume manufacturing of application specific integrated circuits (ASIC's) for commercial and military markets, prototype and process development markets, and mask replication. These markets demand a high degree of flexibility from the lithography tool, and this can only be achieved in a granular (small, inexpensive) system. Thus, there is a need for a compact x-ray source operating at a wavelength around 11 Å, with sufficient brightness (power per area per unit solid angle) to achieve sub-0.13 µm resolution and acceptable wafer throughput.

Figure 3:
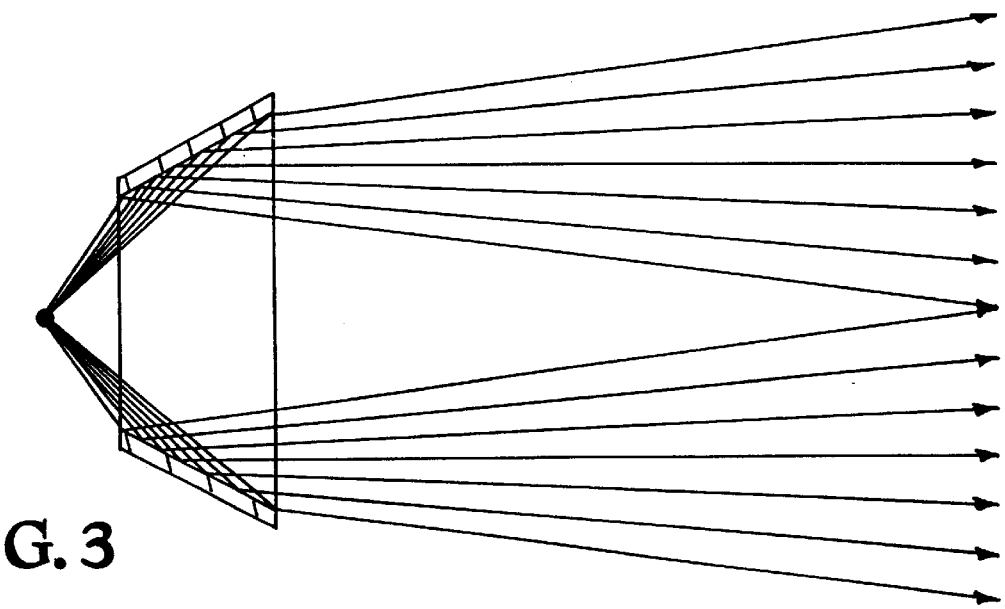
FIG. 3 shows a cross-section of a tubular optic having a grazing reflection inner mirrored surface, a circular cross-section, and a polynomial shape.

The first x-ray collimators for proximity lithography fabricated at the Lawrence Livermore National Laboratory (LLNL) was near-conical polynomial shaped structures having highly reflective interior surfaces. The shape of the reflecting surface is designed to transform a portion of the spherical radiation pattern produced by a point source into a quasi-parallel beam of x-rays, capable of illuminating a full print field at near normal incidence angles. FIG. 3 shows an optic having a grazing reflection mirror, a circular cross-section, and a polynomial shape described by a sixth order polynomial. The coefficients of the polynomial are chosen to produce a relatively uniform intensity distribution over the illuminated field by accounting for the differential solid angle of incoming rays, the angular dependent reflectivity, and the direction of the exiting rays. A beam block stops direct irradiation of the mask by unreflected rays, as in FIG. 1.

These initially fabricated optics were single reflection designs that were fabricated using replica optics techniques to produce high quality surfaces. The fabrication technique uses an aluminum mandrel coated with electroless Ni, diamond turned, and flow polished to a 3–5 Å roughness. The mandrel is then dc sputter coated with a carbon parting layer, followed by a 300 Å gold mirror layer, and then a 1.2 mm thick substrate multilayer of $W_3Re$ and Cu. These layers are overcoated by a 1-mm thick electroplated Ni sealing layer.

The debris shield/beam block structure, such as shown at 16 in FIG. 1, consists of a 2 µm thick polypropylene film disk with a 5 mil thick 6.35 mm diameter lead disk attached to the center of the disk and then mounted coaxially with, and immediately in front of, the source end of the collimator. The lead disk serves as the beam block to prevent direct irradiation of the mask, and the film serves to both support the beam block and to prevent debris contamination of the collimator.

This initial collimator was able to fully illuminate a 36×36-mm print field and consequently produces a 51-mm diameter circular illumination field. The global divergence at the outer edge of the illumination field was designed to be 28 mrad (20 mrad at the print field edge) and −10 mrad at the center. Although this collimator has many useful characteristics, a divergence defect at the center of the print field prevents useful features from printing in that region. Rays arrive at the mask from different points on the collimator mirror and therefore are incident at substantially different angles. The advanced scanning design of FIG. 4 uses a paraboloidal reflector that produces a ring shaped illumination field, which is then scanned across the print field and thus avoids the central defect.

Figure 4:
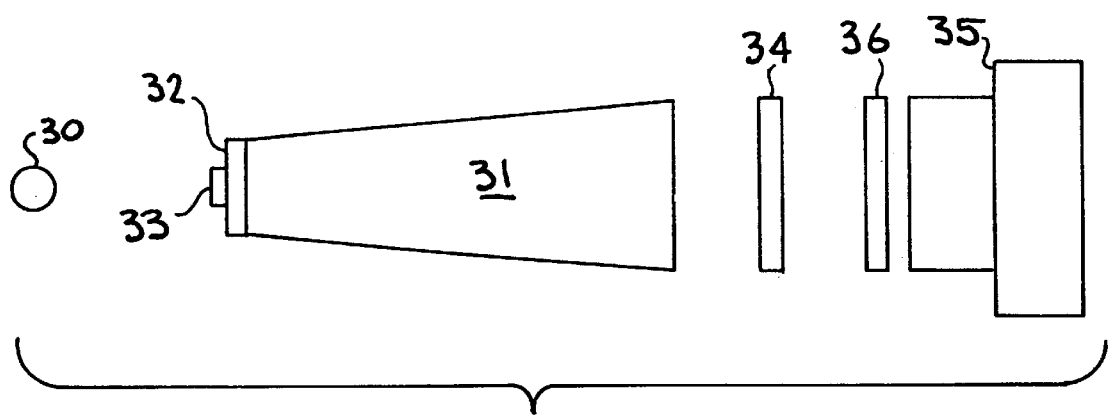
FIG. 4 illustrates an experimental arrangement for collimator characterization.

The performance of this collimator was analyzed using an x-ray CCD camera in the geometry shown in FIG. 4. The gain was determined by comparing the x-ray intensity measured by the CCD both with and without the collimator in place. For measurements of the global and local divergence, a pinhole array was interposed between the collimator and the camera, and the location of the projected images were compared to corresponding pinhole location (modified Hartmann test). The experimental apparatus of FIG. 4 comprises an x-ray source 30, a collimator 31 having a tubular optic therein and having a debris filter and beam block support 32 retaining a beam block 33 located at the entrance or source end of collimator 32, a pinhole array 34, and a CCD camera 35 with a UV filter 36.

A radial average of the 2D x-ray distribution for the image, produced by the CCD camera of FIG. 4, was measured as a function of gain (increase in delivered intensity) and compared to the gains from a series of Monte Carlo ray trace simulations that incorporate the experimental geometry but with different assumed rms surface roughness. The experimental curves fall mainly between the 5 Å and 10 Å roughness curves, providing strong evidence that the present method is capable of producing very smooth and therefore highly reflective and efficient x-ray optics. In addition, fabricated optics have been measured using AFM and shown to have a surface roughness <6.5 Å rms.

Using a pinhole array such as shown in FIG. 4, images were obtained. The global divergence (incident angles on the array) as a function of radial position can be determined by comparing the centroid of each of the small pinhole images to the known location of the pinhole. The results of the global divergence determinations showed that the measured values compared well with values expected from an analytic determination of global divergence using the experimental geometry and the theoretical optic shape, thus confirming excellent figure control.

By using the same pinhole array images, the local divergence (spread of incident angles) as a function of radial position can be estimated from the ratio of the FWHM of the spot cast by each pinhole and the distance between the pinhole array and the camera image plane. A typical pinhole image indicated values of about 1 mrad except in the center where the values reach 2 mrad. These values are very close to lithography specifications (2–5 mrad for the 3σ width).

Figure 5:
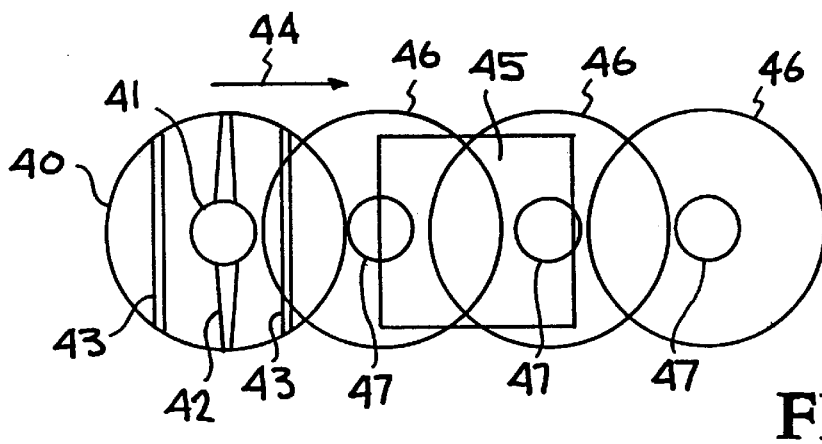
FIG. 5 is a schematic showing a collimated ring field scanned across a lithographic print field.

FIG. 5 shows an optical device using a scanning paraboloidal shell x-ray collimator optic to increase by about 10 times the number of x-rays delivered to a mask of an x-ray lithography system. The optic consists of a truncated paraboloidal shell with an interior surface that is an x-ray multi-layer mirror. When positioned such that the point source is at the focus of the parabolic shape, rays emanating from the source enter the small end of the optic, are reflected by the mirrored surface, and exit the optic in a parallel beam.

Rays from the source are prevented from passing directly through the optic by a beam block placed at the entrance to the optic. The beam block consists of 2 mil lead foil that is capable of totally absorbing the incident x-ray radiation. The beam block can be supported by a thin polypropylene film that has been affixed to a mechanical ring support. The lead foil is attached to the film using epoxy. The film further serves to block target debris generated by the source and prevents debris contamination of the x-ray mirror surface. The film can also be coated with a thin metal layer, typically aluminum, and then serves to block ultraviolet radiation from the source that would otherwise have the potential of damaging the mask surface. Because the central portion of the optic is blocked, the collimator produces an annular or ring field. To uniformly illuminate the print field, the ring field is scanned across the print field by either moving the source and collimator or by scanning the wafer. In either case, a uniform intensity distribution is obtained by using a shaped beam block or obscuration.

One advantage of a scanning collimator is that imperfections of the reflecting surface that would produce intensity non-uniformities are to a significant extent averaged out by the scanning process. Thin struts oriented perpendicular to the direction of motion can be used to support the thin UV/debris filter because the scanning process will minimize any shadowing effect caused by these struts. As seen in FIG. 5, the optic 40 has a beam block 41, a support/flat field mask 42, and a pair of thin filter supports 43. As a beam indicated by arrow 44 passes the print field 45 as indicated by the illumination pattern 46. The print field 45 is uniformly exposed even though a central spot 47 is not illuminated.

Figure 6:
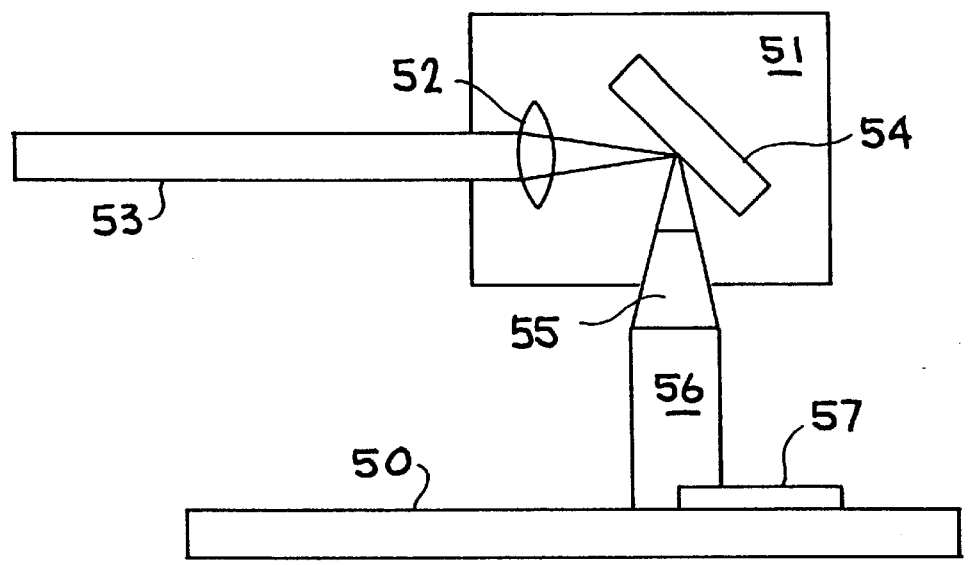
FIG. 6 illustrates a schematic of a scanning collimator system.

FIG. 6 is a schematic of a possible scanning collimator system where the focusing lens, laser target, and collimator are all scanned on a single stage. Alternatively, the collimator and source assembly can remain fixed and the mask scanned past the collimated beam by a scanning stepper. As shown in FIG. 6, the scanning collimator system comprises a stepper 50, and a scanning stage 51 having therein a focusing lens 52 for laser beam 53, a target tape drive 54 and a collimator 55, which produces a collimated x-ray beam 56 that is directed onto a mask 57 located on the stepper 50.

Figure 7:
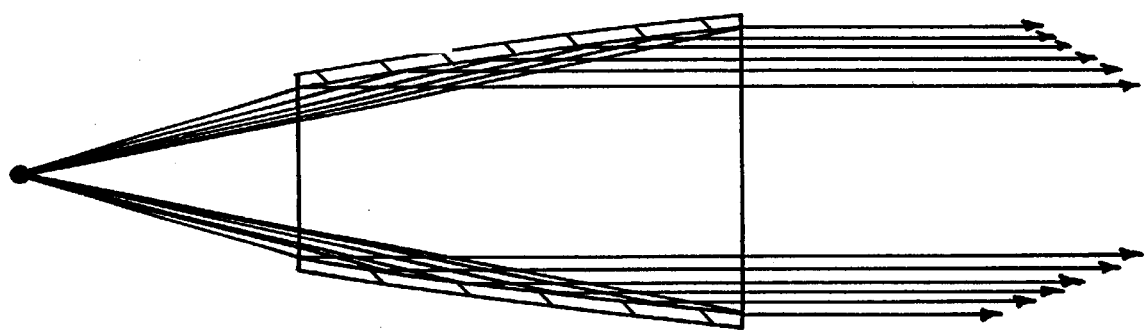
FIG. 7 graphically illustrates an example of a truncated paraboloidal collimator that produces a parallel beam ring field.

Because the scanning process overlays rays reflected from different places on the collimator mirror onto a single point on the mask, it is necessary that the collimator have zero global divergence everywhere (i.e., the average incident angle of rays on the mask must be perpendicular to the mask surface). The collimator shape that produces the required x-ray beam of parallel rays is a truncated paraboloid of revolution, with the source placed at the focus. An example of this class of collimator is shown in FIG. 7.

Efficient scanning systems must use resonance reflection mirrors. These mirrors would consist of 40–50 alternating layers of $W_3Re$ or Rh and $B_4C$ with d-spacings ranging from about 28 to 56 Å. At the central wavelength of the bandpass (11 Å), this range of d-spacings corresponds to reflection angles of 5.5° to 11°. These angles are significantly greater than those possible with grazing reflection (<3.5°), and thus the collection solid-angle is substantially increased. To correctly predict gains of these collimators, account must be taken of the finite bandpass of the mirror, which is narrower than the spectral width of a typical laser produced copper plasma. Nevertheless, gains using these systems can be significant. See Table 1.

Three parameters will define a paraboloidal collimator geometry: the shape given by f, the entrance position (z-coordinate), and the exit position (z-coordinate). The integrated dose given will have a minimum at some y-value on the mask. The mask is assumed to be scanned in the x direction. For a uniform exposure, a shaped obscuration must be used to attenuate the intensity at other values of y to match this minimum. It is therefore this minimum dose point that determines the overall dose and the gain. By maximizing the minimum dose value through variation of these three parameters, the optimum collimator design can be achieved. Other subsidiary constraints must also be considered. These include limiting the source-to-collimator distance to no less than 2 cm, and limiting the variation in local divergence to 5 mrad or less. By using this optimizing procedure and then determining the gain by comparing the dose with and without a collimator (with the mask at the relevant distance), a table of gain values can be determined for different field sizes, as shown in Table 1.

TABLE 1

| Calculated gain values for resonance reflection collimators | | | | |
|---|---|---|---|---|
| print field size (mm) | 20 × 20 | 25 × 25 | 25 × 36 | 25 × 50 |
| gain (20 mrad, no He) | 6.7 | 4.5 | 6.6 | 8.9 |
| gain (20 mrad, 1 atm He) | 9.0 | 6.6 | 11.7 | 19.8 |
| gain (5 mrad, 1 atm He) | 393 | 370 | 1135 | 3863 |

In Table 1, three gain values are given for each of four field sizes. The first gain assumes that the maximum global divergence at the edge (not the corner) of the print field is 20 mrad and that there is no He absorption. The second gain value includes the effect of He absorption, and the third gain value assumes the maximum global divergence is 5 mrad and the effect of He is included. The gains depend on the allowed maximum global divergence, but in all cases the gains are significant.

For certain applications, high-brightness rotating anodes can be used as x-ray sources instead of laser produced plasmas for low-throughput lithography applications. The collimator may have to be placed more than 2 cm from the source so as not to interfere with the optics of the electron beam. In order to capture the same large solid angle as described in the previous section, the optic must have a larger diameter. The resultant ring field is now substantially larger than the print field to be illuminated and is inefficient at delivering x-rays to the mask. This difficulty may be remedied by a two-element axicon system.

The first element is a replicated optic having a multilayered mirrored interior that serves to collect the source x-rays and redirects them towards the optical axis. The second optic has a reflecting exterior surface that serves to produce a collimated ring beam having an outer diameter that is only slightly larger than the print field. This second optic is long, has a small diameter, uses grazing reflection, and can be made by standard exterior surface polishing techniques. At least two configurations are possible.

The first configuration is the well-known Wolter III telescope (see Michette, 'Optical Systems for Soft X-Rays', Plenum 1986). In this case, the first optic having a mirrored interior is a truncated ellipsoid of revolution with the source at one focus. This optic refocuses x-rays from a point source at the first focus to a point at the second focus. The second optic is a truncated paraboloid of revolution having its focus coincident with the second focus of the ellipsoid. The paraboloid having a reflective exterior surface reflects the converging rays to produce a small diameter collimated ring beam.

Figure 8:
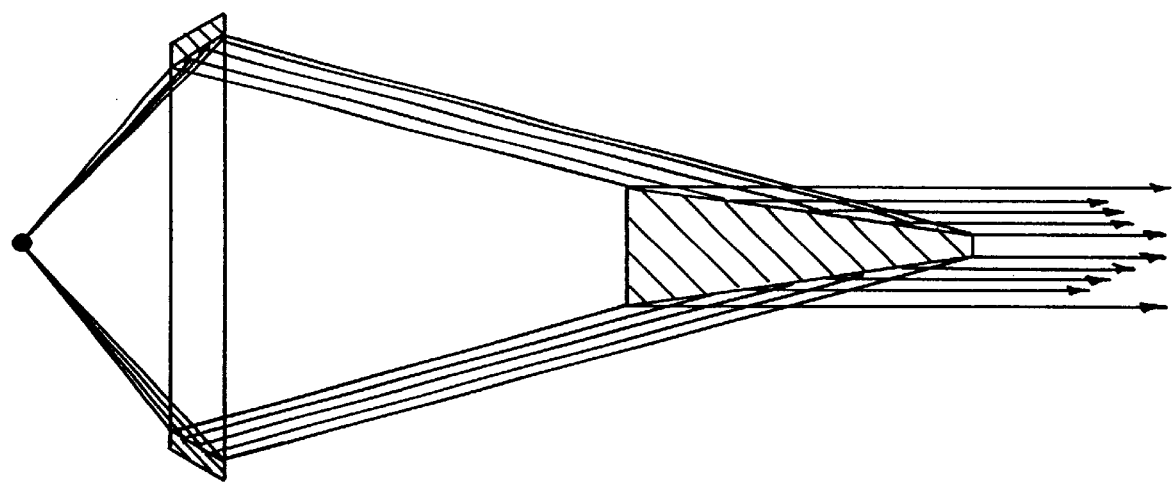
FIG. 8 graphically illustrates an axicon scanning collimator.

A second configuration uses a 'tilted' truncated paraboloid of revolution as the first optic is shown in FIG. 8. As with the previous configuration, this element has a mirrored interior surface and is made using the replica techniques disclosed herein. This element serves to form a collimated ring beam, but because of the tilted nature of the paraboloidal shape, the beam is directed towards the optical axis. The second optic in this configuration is a linear cone having a grazing reflection exterior mirror that turns the converging ring beam to form a small diameter collimated ring beam traveling parallel to the axis. To maximize the collection solid angle, the first element uses a multilayer mirror. When used with narrow-band characteristic x-rays produced by rotating anode x-ray tubes, scanning axicon collimators of the type disclosed can produce very large gains of 25–50.

Many other optical configurations for lithography are possible using reflective optics of the type described here. These optics can be used in projection lithography systems in addition to the proximity lithography applications described above. For projection lithography, similar systems would be used, but only a portion of the annular beam is used, or alternatively a portion of the annular beam is scanned across the print field.

The principal tool used to determine the detailed structure of macromolecules is x-ray crystal diffraction. Although high x-ray fluences can be obtained at synchrotron facilities, most structural determinations are made using smaller and more convenient systems based on rotating anode x-ray generators. Academic, biomedical, and pharmaceutical laboratories worldwide have these or similar systems. For large macromolecules, the typical time required to obtain a data set from one crystal sample is one week; it can take more than a day to determine that a sample is unsuitable for measurement.

A typical state-of-the-art system consists of a high-brightness 5 kW rotating copper anode source and two orthogonally oriented nickel mirrors used for focusing and wavelength selection. Monte Carlo ray-trace simulations of this system indicate only $10^{-8}$ of the in-band source photons reach the sample.

Figure 9:
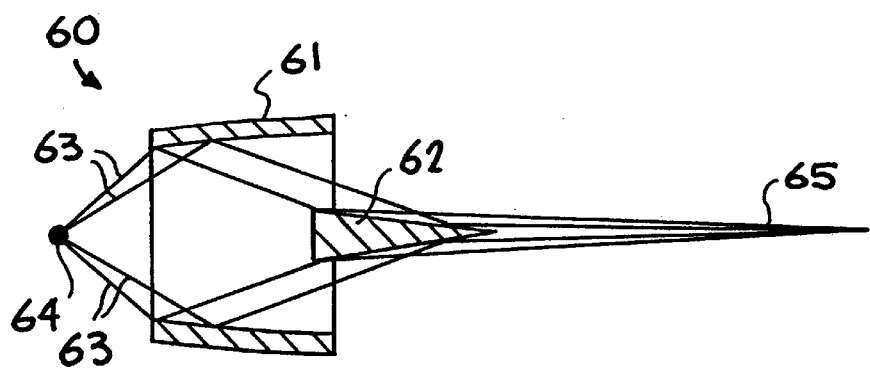
FIG. 9 illustrates an embodiment of a two-element multilayer axicon system for focusing applications.

X-ray optics produced by the replication technology disclosed herein are capable of dramatically improving the x-ray fluence delivered to the sample in current x-ray diffraction systems. FIG. 9 shows a two-element ellipsoidal focusing optic (modified Wolter microscope) having a graded layer thickness resonance mirror. Graded d-spacing multilayer resonance reflectors provide wavelength selection and high reflectivities at relatively large reflection angles (up to 1.8 degrees compared to 0.3 degrees for grazing reflection at 1.5 Å Cu-K wavelength). These larger reflection angles and the geometry of the optic provide a much larger collection solid angle than present mirrors. Simulations indicate that a 10-to-100-fold improvement in x-rays delivered to a sample could be obtained leading to a proportionally reduced measurement time.

Monte Carlo ray-trace codes were used to produce a novel axicon design capable of delivering 10× to 100× the current x-ray fluence to the sample. The design shown in FIG. 9 uses a collecting optic that is a truncated ellipsoid of revolution with a reflecting interior surface. The source is positioned at one focus. The second optic is a truncated hyperboloid of revolution with a reflecting exterior surface. The appropriate focus of the hyperboloid is coincident with the second focus of the ellipsoid. The second element acts to partially collimate the converging rays gathered by the ellipsoid and direct then to the sample. The hyperboloidal shape of the second element can be approximated by a linear cone with little loss in focused fluence. The two element multilayer mirror system, as shown in FIG. 9 and generally indicated at 60, comprises an ellipsoidal internal mirror 61 and a conoidal external mirror 62. Energy 63 from a source 64 is reflected by internal mirror 61 onto external mirror 62 to a sample 65.

Mirrors made of alternating layers of low and high-Z materials are able to efficiently reflect at much larger angles. Because the average reflection angle varies with axial position on the optic, the d-spacing must also vary. These mirrors comprise 40–50 alternating layers of $W_3Re$ and $B_4C$ with d-spacings ranging from 25 to 100 Å. At the central wavelength of the bandpass (1.5 Å), this range of d-spacings corresponds to reflection angles of 1.8° to 0.5° with peak reflectivities of greater than 50%. The wavelength bandpass at any given resonant angle is sufficiently narrow to discriminate between the Cu $K\alpha$ and $K\beta$ x-rays, allowing only the desired wavelengths to reach the sample.

Figure 10:
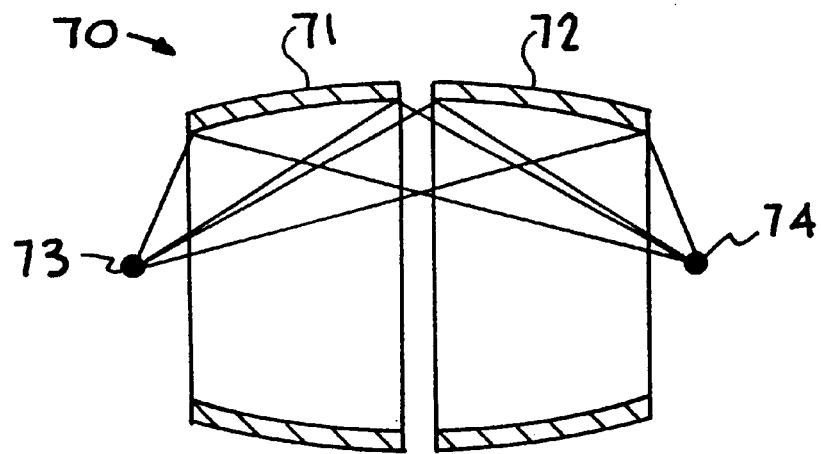
FIG. 10 illustrates ellipsoidal concentrating mirrors.

For the case in which the collection optic can be placed sufficiently close to the source, a single element ellipsoidal mirror system can be used. In this case, the source is placed at the first focus of the truncated ellipsoid of revolution and the sample is placed at the second focus. This optic has a mirrored interior and is made using the replica techniques described herein. To provide a larger collection solid angle, the optic can be made as two sections as shown in FIG. 10. The optic is generally indicated at 70 and has two internal mirror sections 71 and 72 with a source 73 located at a first focus point and a sample 74 placed at the second focus point.

Maximum efficiency is most often achieved with the large reflection angles produced by multilayer mirrors. This optic is relevant for applications where it is desirable to concentrate x-rays from a small source to spot on the sample. Common applications include crystallography and x-ray microfluorescence.

In certain x-ray fluorescence or spectroscopic measurements, it is desirable to efficiently collect x-rays from the source region, selecting a narrow band of those x-rays for detection or analysis. This can be accomplished with a single element or multi-element x-ray optical system. For instance, certain microfluorescence analysis systems use a well-focused beam of x-rays or electrons to excite the atoms in a small region of the sample being analyzed. The characteristic x-rays emitted from this region can be used quantify the elemental constituents of the sample. A single focusing element such as an ellipsoidal optic could be used to collect the emitted characteristic x-rays. In this case, the optic gives significantly greater x-ray collection and therefore higher instrumental sensitivity. If the collecting optic uses a multilayer reflector, it is capable of selecting a specific wavelength to analyze. In another case, the collecting optic could use a grazing reflection surface so a broad range of wavelengths are reflected to a energy dispersive detector, which is capable of distinguishing the different characteristic x-ray energies. Many other optical configurations for focusing or efficiently collecting x-rays are possible using these optics.

Figure 11:
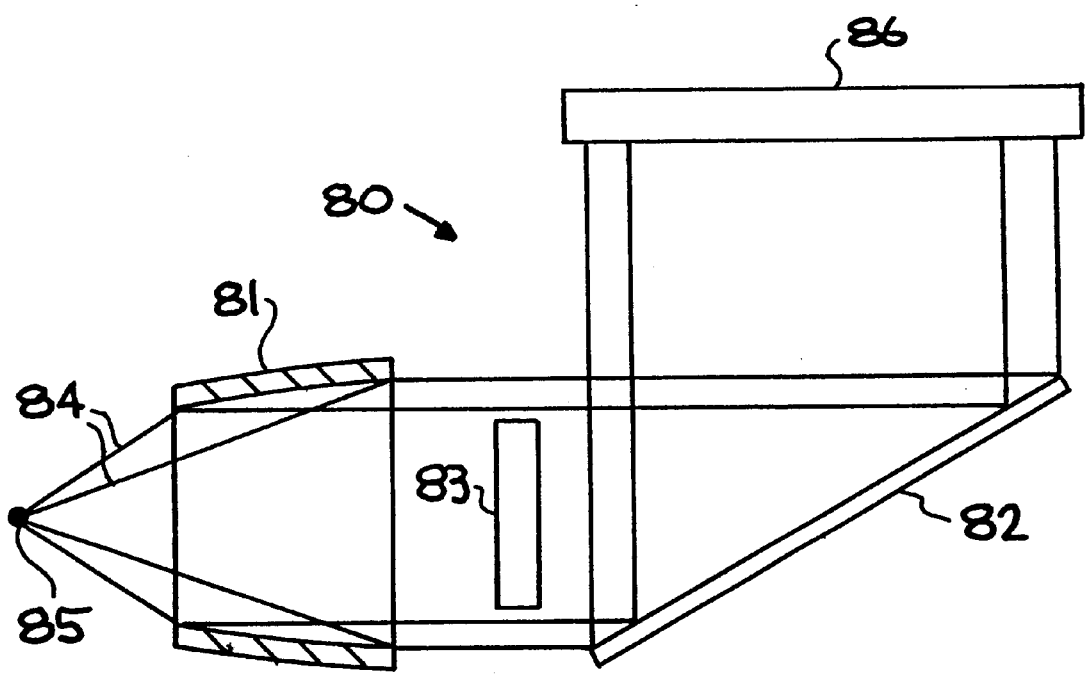
FIG. 11 illustrates an embodiment of a two-element collector/analyzer system.

Another such system for collecting and analyzing x-rays comprises a paraboloidal collector using grazing incidence reflection that produces a collimated beam of collected x-rays, followed by a second element that is a flat narrow band-pass multilayer mirror. The collimated beam allows the multilayer reflector to be formed by a simple constant d-spacing flat mirror. The reflected x-rays are directed to an area detector or detector array as shown in FIG. 11. Alternatively, a second parabolic mirror can be used after the flat multilayer mirror to refocus the parallel beam to a small region.

The embodiment shown in FIG. 11, generally indicated at 80, comprises a grazing reflection parabolic mirror 81 and a flat multilayer mirror 82, with a beam block 83 therebetween. X-rays indicated at 84 from a source 85 are reflected by mirrors 81 and 82 onto a detector 86. The beam block can be used to stop unreflected uncollimated source x-rays. The paraboloidal mirror is made using the replica methods previously described.

Figure 12:
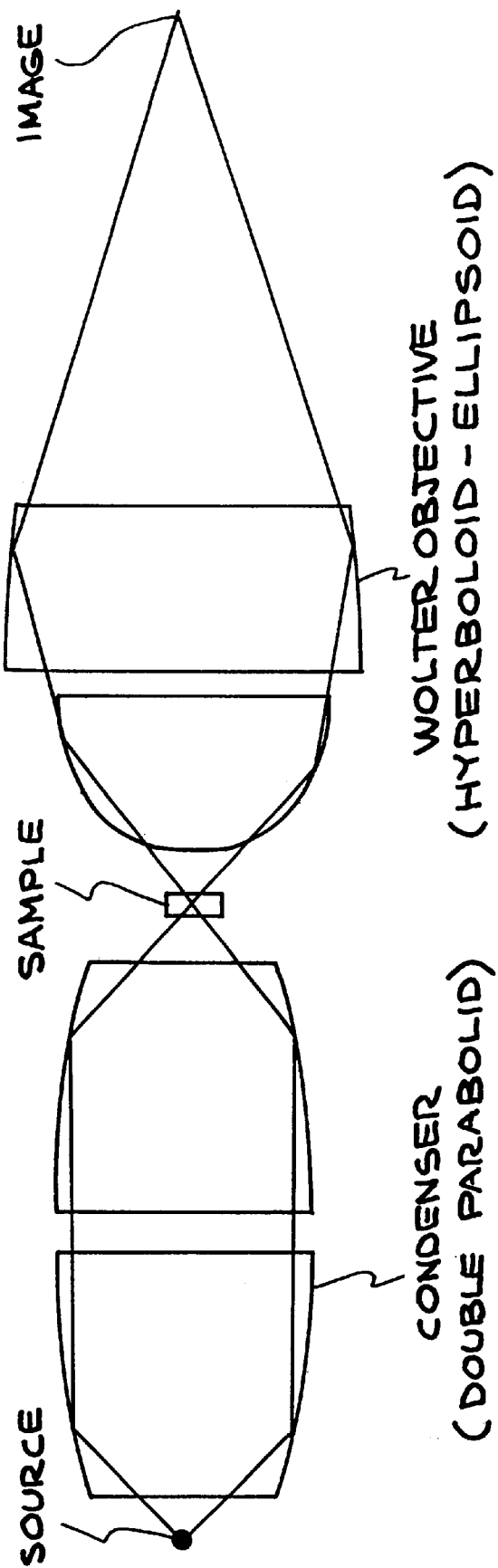
FIG. 12 illustrates an x-ray microscope system having a two-element paraboloidal condenser and a two-element hyperboloidal-ellipsoidal Wolter objective.

Wolter microscopes are used to efficiently produce high quality x-ray images of small emitting or illuminated samples. These two-element systems, such as shown in FIG. 12, consist of a truncated hyperboloid 90 of revolution followed by a truncated ellipsoid 92 of revolution. FIG. 12 illustrates an x-ray microscope system that consists of a two-element paraboloidal condenser and the two-element hyperboloidal-ellipsoidal Wolter objective.

Conventional high quality microscopes consist of diamond turned and repetitively polished elements that cost several million dollars to fabricate. The replica techniques described herein will produce similar quality optics for a small fraction of the present cost. This is important in many areas of research where x-ray microscopy is used, including biological imaging and inertial confinement fusion. By obtaining multiple views of the same object, these microscopes can also be used to produce tomographic images used to obtain 3-D images of semiconductor devices for failure analysis and quality control.

Zone plate microscopes typically consist of a condenser/monochromator that illuminates a sample with x-rays. Transmitted x-rays from a small region of the sample are then focused by an objective zone plate onto a detector. The sample is usually scanned to form the complete image. The present invention allows less expensive and more efficient microscopes to be made using the appropriate replica optic to serve as the condenser (a paraboloid for focusing a collimated beam or an ellipsoid for focusing x-rays from a diverging point source).

It has been shown that the present invention provides a new class of x-ray optical devices that have a tubular shape, open at both ends, with the interior surface being highly reflective to x-rays within a wavelength band of interest. The tubular shaped x-ray optical devices are fabricated using a super-polished mandrel on which is sputter deposited layers of reflecting material, thus forming the optic from the inside out. Applications of these x-ray optics include x-ray proximity or projection lithography for semiconductor manufacturing, x-ray crystallography for macromolecular structural determinations, x-ray fluorescence analysis for material studies and semiconductor manufacturing process control, x-ray microscopy and radiography for biological imaging, tomography, semiconductor device failure analysis and quality control, and x-ray microscopes used in inertial confinement fusion studies.

While particular embodiments, materials, and parameters have been described and/or illustrated to exemplify and teach the principles of the invention, such are not intended to be limiting. Modifications and changes may become apparent to those skilled in the art, and it is intended that the invention be limited only by the scope of the appended claims.

What is claimed is:

1. A replicated x-ray optical device comprising an inner reflecting surface, a supporting multilayer, and a mechanical supporting outer layer.

2. The device of claim 1, wherein the inner reflecting surface has a smoothness of less than about 12 Å mrms.

3. The device of claim 1, wherein said mechanical supporting outer layer comprises an electroplated material deposited on the multilayer.

4. The device of claim 3, wherein the mechanical outer layer comprises a material selected from the group consisting of nickel, copper, copper-nickel alloys, copper-tin alloys, stainless steel, and iron-nickel alloys.

5. The device of claim 1, wherein the supporting multilayer comprises alternating layers of (1) a first material comprising a material the same as that of the reflecting surface and (2) a second material comprising a metal.

6. The device of claim 5, wherein the metal is selected from the group consisting of copper, copper-nickel alloys, nickel, gold, and silver.

7. The device of claim 1, wherein the supporting multilayer is not a reflective mirror.

8. The device of claim 1, further comprising a metal layer intermediate the supporting multilayer and the supporting outer layer.

9. The device of claim 8, wherein the metal layer comprises copper and the outer layer comprises nickel.

10. The device of claim 1, wherein the reflecting surface comprises a material forming a grazing reflection surface.

11. The device of claim 1, wherein the reflecting surface comprises a multilayer forming a resonant multilayer surface.

12. The device of claim 1, wherein the reflecting surface comprises a material selected from the group consisting of rhenium, rhenium alloys, tungsten alloys, rhodium, gold, platinum, nickel, and nickel alloys.

13. The device of claim 1, wherein the device is tubular in configuration.

14. The device of claim 13, wherein the device is open at both ends.

15. The device of claim 1, wherein the device has a shape selected from the group consisting of truncated paraboloidal, ellipsoidal, hyperboloidal, and polynomial shells of revolution, and combinations thereof.

16. The device of claim 1, wherein the device comprises a collimator having a polynomial shape that produces a collimated x-ray beam from an x-ray source.

17. The device of claim 16, wherein the reflecting surface is selected from the group consisting of grazing reflection mirrors and resonant reflection mirrors.

18. The device of claim 1, wherein the device comprises a collimator having a paraboloidal shape that produces a collimated x-ray beam from an x-ray source.

19. The device of claim 18, wherein the reflecting surface is selected from the group consisting of grazing reflection mirrors and resonant reflection mirrors.

20. The device of claim 1, wherein the device comprises a collector that collects x-rays emitted from an x-ray source.

21. The device of claim 1, wherein the device comprises a collector that selects a selected band of x-ray wavelengths from the source.

22. The device of claim 20, wherein the reflecting surface is selected from the group consisting of grazing reflection mirrors and resonant reflection mirrors.

23. The device of claim 1, wherein the device comprises a focusing element that focuses x-rays emitted from an x-ray source.

24. The device of claim 1, wherein the device comprises one of the group consisting of a condenser and an objective lens.

25. The device of claim 1, wherein the device comprises a magnifying element that magnifies x-rays emitted from an x-ray source.

26. A method for fabricating an x-ray optical device, comprising:

depositing at least one material layer onto a mandrel having a smooth surface to form a reflecting surface;

depositing a supporting multilayer on the material layer;

depositing a mechanical supporting outer layer on the multilayer; and removing the mandrel from the optical device.

27. The method of claim 26, further comprising providing a mandrel with an outer surface having a surface smoothness of less than 12 Å rms.

28. The method of claim 26, wherein depositing the material layer is carried out by sputter deposition.

29. The method of claim 26, wherein depositing the material layer comprises depositing a plurality of alternating layers of two or more materials to form a reflective multilayer.

30. The method of claim 26, wherein depositing the mechanical outer layer is carried out by electrodeposition.

31. The method of claim 26, further comprising depositing a parting layer on the mandrel before depositing the material layer.

32. The method of claim 31, wherein the parting layer comprises a material selected from the group consisting of amorphous carbon and carbides.

33. The method of claim 31, wherein the parting layer forms a uniform adhesion layer on the mandrel.

34. The method of claim 26, further comprising reusing the mandrel for fabricating more than one optical device.

* * * * *